United States Patent
Liu et al.

(10) Patent No.: US 10,636,925 B2
(45) Date of Patent: Apr. 28, 2020

(54) METHOD FOR MAKING PHOTOCAPACITOR

(71) Applicants: Tsinghua University, Beijing (CN); HON HAI PRECISION INDUSTRY CO., LTD., New Taipei (TW)

(72) Inventors: Ru-Hao Liu, Beijing (CN); Chang-Hong Liu, Beijing (CN); Shou-Shan Fan, Beijing (CN)

(73) Assignees: Tinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 43 days.

(21) Appl. No.: 16/141,997

(22) Filed: Sep. 26, 2018

(65) Prior Publication Data

US 2019/0123228 A1  Apr. 25, 2019

(30) Foreign Application Priority Data

Sep. 30, 2017 (CN) .......................... 2017 1 0920031

(51) Int. Cl.
| | |
|---|---|
| H01L 31/053 | (2014.01) |
| H01L 31/18 | (2006.01) |
| H01L 31/0216 | (2014.01) |
| H01L 31/0203 | (2014.01) |
| H01L 51/42 | (2006.01) |
| H01L 27/30 | (2006.01) |
| H01G 11/08 | (2013.01) |
| H01G 11/36 | (2013.01) |

(Continued)

(52) U.S. Cl.
CPC ........... *H01L 31/053* (2014.12); *H01G 11/08* (2013.01); *H01G 11/36* (2013.01); *H01G 11/84* (2013.01); *H01G 11/86* (2013.01); *H01L 27/301* (2013.01); *H01L 31/0203* (2013.01); *H01L 31/02164* (2013.01); *H01L 31/18* (2013.01); *H01L 51/4213* (2013.01); *H01L 51/4226* (2013.01); *H01L 51/0048* (2013.01); *H01L 51/447* (2013.01); *H01L 2251/306* (2013.01)

(58) Field of Classification Search
CPC ... H01L 31/053; H01L 31/18; H01L 31/0203; H01L 51/4213; H01L 51/4226; H01L 51/0048; H01L 27/301; H01L 2251/306; H01G 11/36; H01G 11/86; H01G 11/08; H01G 11/84
See application file for complete search history.

(56) References Cited

U.S. PATENT DOCUMENTS

| | | | |
|---|---|---|---|
| 8,816,465 B1 * | 8/2014 | Gardner ................ | H01L 31/053 257/461 |
| 9,001,495 B2 * | 4/2015 | Martini ................. | B32B 37/025 361/502 |

(Continued)

FOREIGN PATENT DOCUMENTS

WO   WO-2017139258 A1 *   8/2017   .......... H01G 9/2068

*Primary Examiner* — Zandra V Smith
*Assistant Examiner* — Jeremy J Joy
(74) *Attorney, Agent, or Firm* — ScienBiziP, P.C.

(57) ABSTRACT

A method for making photocapacitor is provided. The method includes: preparing a perovskite solar cell, preparing a first supercapacitor electrode, deposing the first supercapacitor electrode onto the perovskite solar cell, dissolving a portion of a cell packaging structure and a first material, and preparing a second supercapacitor electrode opposite to the first supercapacitor electrode.

15 Claims, 5 Drawing Sheets

(51) Int. Cl.
*H01G 11/84* (2013.01)
*H01G 11/86* (2013.01)
*H01L 51/00* (2006.01)
*H01L 51/44* (2006.01)

(56) References Cited

U.S. PATENT DOCUMENTS

| | | | | |
|---|---|---|---|---|
| 9,159,500 B2* | 10/2015 | Suzuka | | H01G 9/2031 |
| 2006/0219289 A1* | 10/2006 | Skryabin | | H01G 9/2031 |
| | | | | 136/244 |
| 2006/0268493 A1* | 11/2006 | Miyasaka | | H01G 9/2022 |
| | | | | 361/502 |
| 2008/0276987 A1* | 11/2008 | Flood | | H01L 31/035281 |
| | | | | 136/256 |
| 2009/0065042 A1* | 3/2009 | Reynolds | | H01M 10/0562 |
| | | | | 136/244 |
| 2009/0205713 A1* | 8/2009 | Mitra | | B82Y 10/00 |
| | | | | 136/263 |
| 2009/0272946 A1* | 11/2009 | Lu | | H01B 1/04 |
| | | | | 252/511 |
| 2011/0203632 A1* | 8/2011 | Sen | | B82Y 10/00 |
| | | | | 136/244 |
| 2011/0214728 A1* | 9/2011 | Veerasamy | | B82Y 10/00 |
| | | | | 136/256 |
| 2012/0014038 A1* | 1/2012 | Meng | | H01G 11/26 |
| | | | | 361/502 |
| 2012/0313591 A1* | 12/2012 | Brambilla | | H01G 11/68 |
| | | | | 320/166 |
| 2014/0015158 A1* | 1/2014 | Cola | | B01J 23/745 |
| | | | | 264/81 |
| 2014/0035098 A1* | 2/2014 | Dunn | | H01G 11/56 |
| | | | | 257/532 |
| 2014/0150859 A1* | 6/2014 | Zakhidov | | H01L 51/445 |
| | | | | 136/255 |
| 2014/0321027 A1* | 10/2014 | Nguyen | | H01G 11/04 |
| | | | | 361/502 |
| 2015/0144195 A1* | 5/2015 | Irwin | | H01G 9/2027 |
| | | | | 136/260 |
| 2015/0340160 A1* | 11/2015 | Kim | | H01G 9/042 |
| | | | | 361/523 |
| 2015/0349157 A1* | 12/2015 | Chung | | H01L 31/022433 |
| | | | | 136/256 |
| 2016/0086741 A1* | 3/2016 | Lowenthal | | B82Y 25/00 |
| | | | | 361/502 |
| 2017/0148573 A1* | 5/2017 | Zhamu | | H01G 11/02 |
| 2017/0309407 A1* | 10/2017 | Suzuka | | H01G 9/2059 |
| 2018/0226202 A1* | 8/2018 | Yokoyama | | H01L 51/4206 |
| 2018/0374651 A1* | 12/2018 | Blackburn | | H01G 9/2009 |
| 2019/0164699 A1* | 5/2019 | Zeng | | H01L 51/448 |

\* cited by examiner

FIG.5

METHOD FOR MAKING PHOTOCAPACITOR

CROSS-REFERENCE TO RELATED APPLICATIONS

This application claims all benefits accruing under 35 U.S.C. § 119 from China Patent Application No. 201710920031.2, filed on Sep. 30, 2017, in the China Intellectual Property Office, the contents of which are hereby incorporated by reference. The application is also related to co-pending applications entitled, "PHOTOCAPACITOR", concurrently filed.

FIELD

The present disclosure relates to the field of energy storage, and more particularly to solar energy storage.

BACKGROUND

A perovskite solar cell is a type of solar cell which includes a perovskite structured compound. Perovskite solar cells have become commercially attractive with higher efficiencies and low production costs. However, the voltage output of the perovskite solar cell changes as the sunlight changes, as a result the perovskite solar cell is not always suitable to power portable electronics.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to be better illustrate details and features. The description is not to be considered as limiting the scope of the embodiments described herein.

Several definitions that apply throughout this disclosure will now be presented.

The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 1:
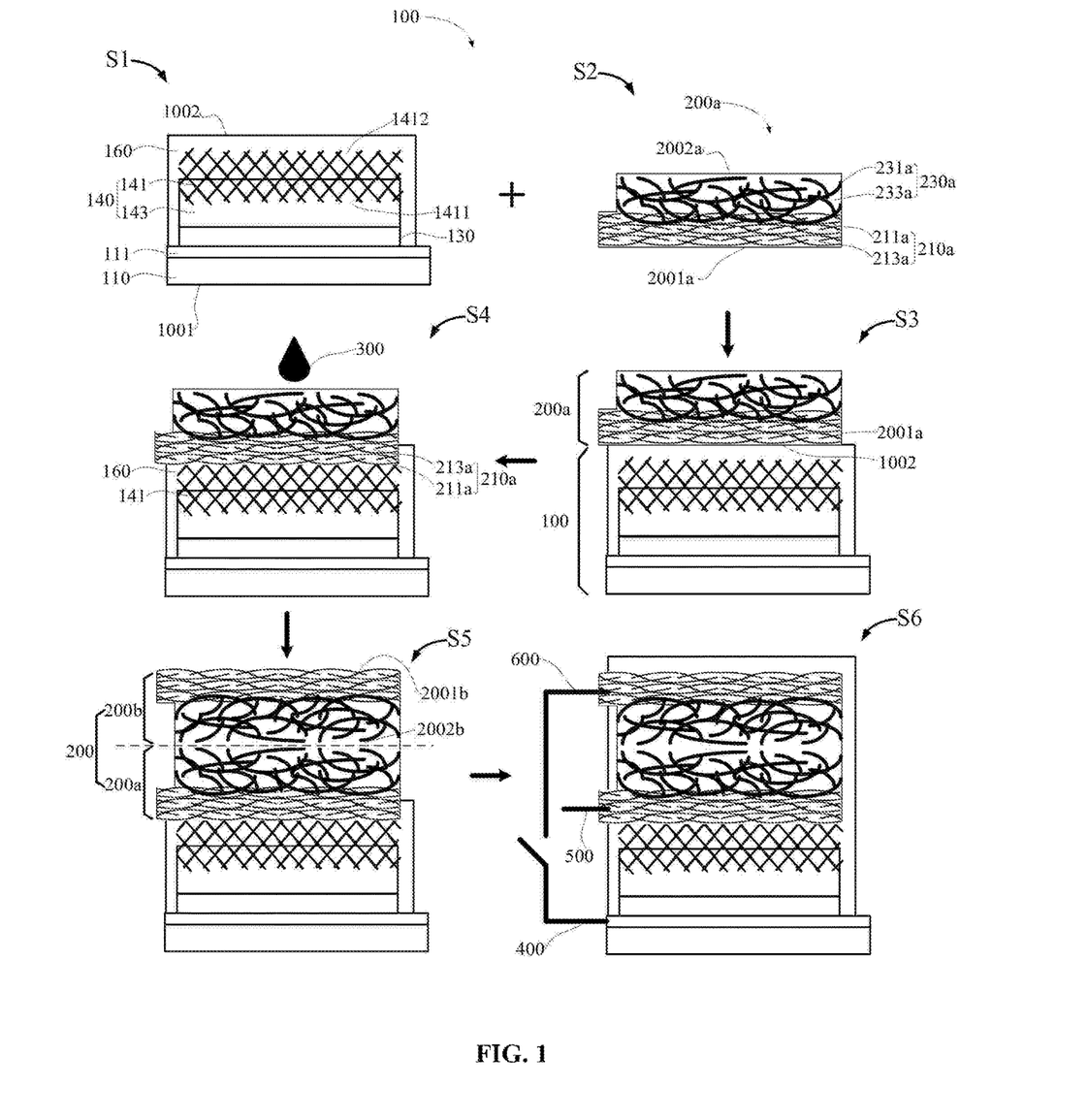
FIG. 1 is a flow diagram of one embodiment of a method for making photocapacitor.

FIG. 1 shows an embodiment of a method for making photocapacitor. The method includes, at least the following steps:

S1, preparing a perovskite solar cell 100 which includes an absorbing layer 140 and a cell packaging structure 160; wherein the absorbing layer 140 includes a third carbon nanotube structure 141 and a perovskite structure 143, the third carbon nanotube structure 141 is a layered structure including a first surface 1411 and a second surface 1412 opposite the first surface, the first surface 1411 is directly contacted with the perovskite structure 143 and the second surface 1412 is directly contacted with the cell packaging structure 160; a surface of the cell packaging structure 160 away from the absorbing layer 140 is defined as a second solar cell surface 1002;

S2, preparing a first supercapacitor electrode 200a which includes a first electrode structure 210a and a second electrode structure 230a stacked with each other, the first electrode structure 210a includes a first carbon nanotube structure 211a comprising a plurality of first carbon nanotubes, adjacent first carbon nanotubes form a plurality of first micropores, some of the first micropores are filled with a first material 213a; a surface of the first electrode structure 210a away from the second electrode structure 230a is defined as an first electrode surface 2001a;

S3, attaching the first supercapacitor electrode 200a onto the perovskite solar cell 100, wherein the second solar cell surface 1002 is directly contacted with the first electrode surface 2001a;

S4, dissolving a portion of the cell packaging structure 160 and the first material 213a until the third carbon nanotube structure 141 and the first carbon nanotube structure 211a in direct contact with each other; and S5, preparing a second supercapacitor electrode 200b opposite to the first supercapacitor electrode 200a.

In step S1, the perovskite structure 143 can be made of perovskite material, such as $MAPbI_3$. The perovskite solar cell 100 can further include conductive glass layer 110 and a blocking layer 130. The conductive glass layer 110, the blocking layer 130, and the absorbing layer 140 are planar structures and stacked with each other. The blocking layer 130 is sandwiched between the conductive glass layer 110 and the absorbing layer 140. A surface of the conductive glass layer 110 away from the absorbing layer 140 is defined as a first solar cell surface 1001, and a surface of the cell packaging structure 160 spaced away from the absorbing layer 140 is defined as a second solar cell surface 1002.

Figure 2:
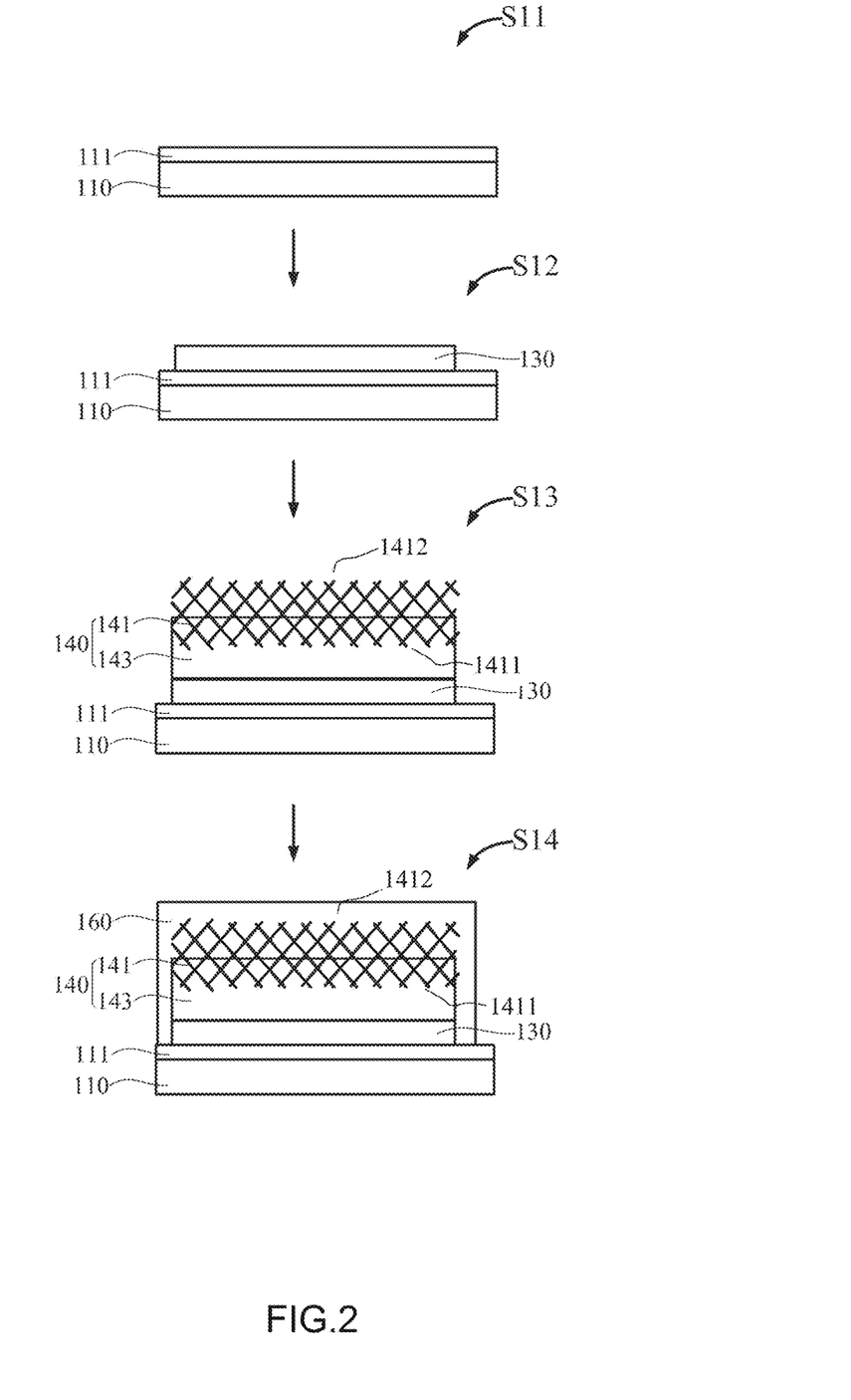
FIG. 2 is a flow diagram of one embodiment of a method for making perovskite solar cells.

FIG. 2 shows an embodiment of a method for making a perovskite solar cell 100. The method includes, at least the following steps:

S11, providing a conductive glass layer 110 with a conductive surface 111;

S12, depositing a blocking layer 130 onto the conductive surface 111;

S13, locating an absorbing layer 140 onto the blocking layer 130 to form a perovskite solar cell preform, wherein the absorbing layer 140 includes a third carbon nanotube structure 141; and S14, depositing a cell packaging material on surfaces of blocking layer 130 and absorbing layer 140 to form a cell packaging structure 160.

In step S11, the conductive glass layer 110 can be ultrasonically cleaned in detergent, deionized water, acetone and isopropanol (IPA) in sequence, dried with compressed nitrogen. In one embodiment, the conductive glass layer 110 is fluorine-doped tin oxide (FTO) glass.

In step S12, the blocking layer 130 can transport electrons and block holes. In one embodiment, the material of the blocking layer 130 is titanium dioxide ($TiO_2$), a compact titanium $TiO_2$ blocking layer is deposited by spin-coating 90 μL of acidic titanium isopropoxide/ethanol solution (70 μL of titanium isopropoxide, 7 μL of 2 M HCl, 1 mL of ethanol) onto the FTO substrate at a speed of 2000 rpm for 50 s, then the FTO substrate is dried at 150° C. for 30 min and annealed at 500° C. for 30 min.

In step S13, the absorbing layer 140 is prepared by depositing a $BX_2$ (a halide of metal B) film onto the blocking layer 130, depositing a carbon nanotube film onto the $BX_2$ film, and coating an AX (halogenated salt of organic amino A) solution onto the carbon nanotube film and heating.

In one embodiment, $BX_2$ is $PbI_2$, AX is $CH_3NH_3I$ solution, and the carbon nanotube is multi-walled carbon nanotube (MWCNT). A $PbI_2$ film is deposited onto the blocking layer 130 by spin-coating 90 μL of $PbI_2$/N, N-Dimethylformamide solution (500 mg/mL) at a speed of 2000 rpm for 50 s. A MWCNT film is deposited onto the $PbI_2$ film by drop-casting 120 μL of MWCNT/chlorobenzene solution (10 mg/mL). 120 μL of $CH_3NH_3$/IPA solution (10 mg/mL) is dropped onto the MWCNT film for 3 min, dried by spinning at 2000 rpm for 50 s and heated in an environment of 100° C. for 30 min to obtain an absorbing layer 140 including a third carbon nanotube structure 141 and a perovskite structure 143 made of $MAPbI_3$.

The third carbon nanotube structure 141 is a layered structure which includes a first surface 1411 and a second surface 1412 opposite to the first surface 1411. The first surface 1411 is directly contacted with the perovskite material (e.g. $MAPbI_3$), and the second surface 1412 is exposed to the air.

The third carbon nanotube structure 141 includes a plurality of third carbon nanotubes joined by van der Waals attractive force therebetween and forming a free-standing film network. Adjacent third carbon nanotubes form a plurality of third micropores. Some of the third micropores are filled with the perovskite material.

In step S14, parts of the micropores of the third carbon nanotube structure 141 are filled with the cell packaging material. The cell packaging material can be Polymethyl methacrylate (PMMA). In one embodiment, a PMMA film is deposited onto the perovskite solar cell preform by spin-coating 0.5 mL of PMMA/toluene solution (100 mg/mL) at a speed of 3000 rpm for 50 s, dried at room temperature.

In step S2, both the first electrode structure 210a and the second electrode structure 230a are planar structures and stacked with each other. A surface of the first electrode structure 210a opposite to the second electrode structure 230a is defined as a first electrode surface 2001a, and a surface of the second electrode structure 230a opposite to the first electrode structure 210a is defined as a second electrode surface 2002a.

The first electrode structure 210a includes a first carbon nanotube structure 211a. The first carbon nanotube film 211a includes a plurality of first carbon nanotubes joined by van der Waals attractive force therebetween. Adjacent first carbon nanotubes form a plurality of first micropores. Some of the first micropores are filled with a first material 213a. The first material 213a can be PMMA.

The second electrode structure 230a includes a second carbon nanotube structure 231a. The second carbon nanotube structure 231a includes a plurality of polymer coated active carbon nanotubes joined by van der Waals attractive force therebetween. Adjacent polymer coated active carbon nanotubes form a plurality of second micropores. Some of the second micropores are filled with a second material 233a. The second material 233a can be supercapacitor electrolytes.

In one embodiment, a method for making the first supercapacitor electrode 200a includes, at least the following steps:

S21, providing an active carbon nanotube (acCNT) film;

S22, soaking the acCNT film in a polymer monomer solution, adding an oxidant solution to the polymer monomer solution to generate a polymer coated acCNT film;

S23, providing a carbon nanotube (CNT) solution, and filtering the CNT solution through the polymer coated acCNT film to create an a CNT-polymer coated acCNT film; the CNT side of the CNT-polymer coated acCNT film is defined as S-side, and the polymer coated acCNT side is defined as P-side;

S24, coating the second material 233a onto the P-side; and

S25, coating the first material 213a onto the S-side.

In step S21, the active carbon nanotube (acCNT) is a carbon nanotube with a hydrophilic functional group. The active carbon nanotube can be created by heating and oxidizing carbon nanotube. In one embodiment, 30 mg of superaligned pure carbon nanotubes was heated in an air environment of 500° C. for 30 min to create an active superaligned carbon nanotubes (acSACNT).

The active carbon nanotubes are dispersed in a solution and filtered to form an active carbon nanotube film. In one embodiment, 30 mL of acSACNT was ultrasonically mixed with ethanol solution (1 mg/mL), and the mixture then filtered to create an acSACNT film.

In step S22, the polymer monomer solution can be created by dissolving a polymer monomer in a solvent. The oxidant solution can be created by dissolving an oxidant in a solvent. The oxidant can polymerize the polymer monomer to form a polymer. The polymer monomer can be aniline, thiophene, pyrrole, acrylonitrile, ethanol, propylene, styrene, chloroethylene, or combination thereof. The oxidant can be selected according to the polymer monomer, such as nitric acid, sulphuric acid, ammonium persulphate, or combination thereof. The solvent can be selected according to the polymer monomer or the oxidant, such as ethanol or methanol.

In one embodiment, the acCNT film is soaked in 40 mL of aniline/HCl aqueous solution (1 M HCl, 0.05 M aniline) at 0° C. for 10 min. Then 40 ml of 0.05 M $(NH_4)_2S_2O_8$ aqueous solution is slowly added into the aniline/HCl aqueous solution. The mixture is kept at 0° C. for 24 h to generate PANI coated acCNT (PANI@acSACNT) film. The PANI@acSACNT film can be cleaned with deionized water, ethanol and acetone, and then dried at 80° C. for 24 h.

In step S23, in one embodiment, 15 mL of SACNT/ethanol solution (1 mg/mL) is filtered through the PANI@acSACNT film, and then dried at 80° C. for 24 h to create an SACNT-PANI@acSACNT film.

In step S24, the second material 233a can be supercapacitor electrolytes. In one embodiment, the second material 233a is PVA electrolytes. 100 μL of PVA/$H_2SO_4$ aqueous solution (10 mg/mL PVA, 0.1 M $H_2SO_4$) is coated onto the P-side, dried at room temperature for 2 h.

In step S25, the first material 213a can be the same as the cell packaging material of perovskite solar cell 100. In one embodiment, the first material 213a is PMMA, the SACNT-PANI@acSACNT film is soaked in PMMA/toluene solution (10 mg/mL) for 30 min, and then dried at room temperature for 5 h. Then the PMMA is removed by acetone.

In step S3, the second solar cell surface 1002 and the first electrode surface 2001a can be closely attached together.

In step S4, the liquid 300 dissolves and reshapes the cell packaging material and the second packaging material. The cell packaging material and the second packaging material can be the same material. In one embodiment, both the cell packaging material and the second packaging material can be PMMA, the liquid 300 is chlorobenzene. 100 μL of chlorobenzene is dropped onto the P-side of the first supercapacitor electrode 200a to dissolve and reshape the portion of the PMMA film that is between the perovskite solar cell 100 and the first supercapacitor electrode 200a.

In step S5, the first supercapacitor electrode 200a and the second supercapacitor electrode 200b together form a supercapacitor 200.

Figure 3:
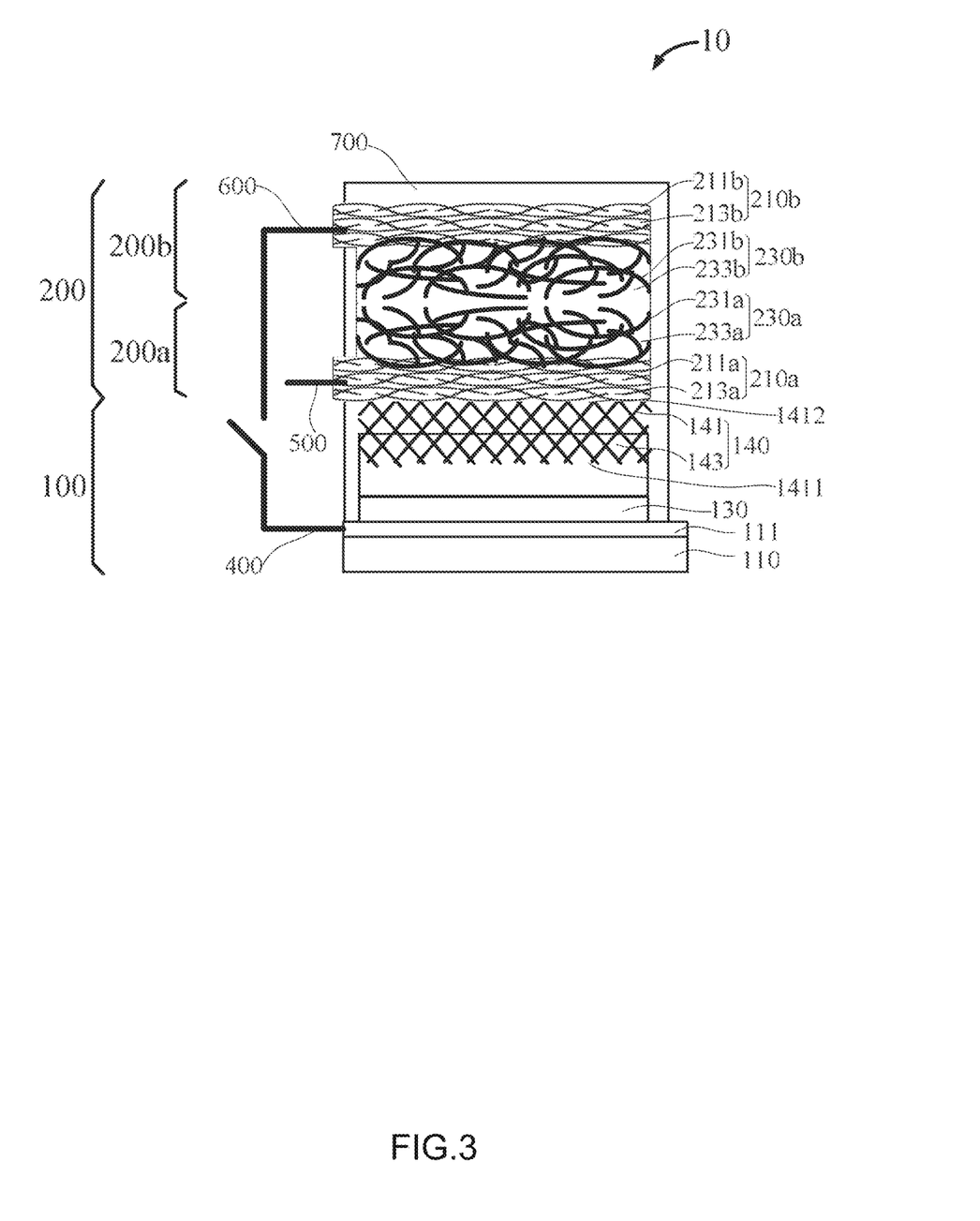
FIG. 3 is a schematic view of one embodiment of a photocapacitor.

FIG. 3 shows an embodiment of a photocapacitor 10. The photocapacitor 10 includes a perovskite solar cell 100 and a supercapacitor 200.

The perovskite solar cell 100 includes a conductive glass layer 110, a blocking layer 130, and an absorbing layer 140. The blocking layer 130 is between the conductive glass layer 110 and the absorbing layer 140.

The conductive glass layer 110 further includes a conductive surface 111. In one embodiment, the conductive glass layer 110 is fluorine-doped tin oxide (FTO) glass.

The blocking layer 130 can transport electrons and block holes. The material of the blocking layer 130 can be $TiO_2$.

The absorbing layer 140 further includes a third carbon nanotube structure 141 and a perovskite structure 143. The perovskite structure 143 can be made of perovskite material, such as $MAPbI_3$.

The third carbon nanotube structure 141 is a layered structure which includes a first surface 1411 and a second surface 1412 opposite to the first surface 1411.

The third carbon nanotube structure 141 includes a plurality of third carbon nanotubes joined by van der Waals attractive force therebetween. Adjacent third carbon nanotubes form a plurality of third micropores. The third carbon nanotubes can be multi-walled carbon nanotubes.

The first surface 1411 is directly contacted with the perovskite structure 143, and some of the micropores near the first surface 1411 are filled with the perovskite material. The second surface 1412 is directly contacted with packaging material, and some of the micropores near the second surface 1412 are filled with the packaging material.

The supercapacitor 200 includes a first supercapacitor electrode 200a and a second supercapacitor electrode 200b opposite to the first supercapacitor electrode 200a.

The first supercapacitor electrode 200a further includes a first electrode structure 210a and a second electrode structure 230a stacked with each other.

The first electrode structure 210a includes a first carbon nanotube structure 211a and a first structure made of a first material 213a, the first carbon nanotube structure 211a includes a plurality of first carbon nanotubes joined by van der Waals attractive force therebetween. Adjacent first carbon nanotubes form a plurality of first micropores. Some of the first micropores are filled with the first material. The first carbon nanotubes can be superaligned pure carbon nanotubes. The first material can be PMMA.

The second electrode structure 230a includes a second carbon nanotube structure 231a and a second packaging structure made of a second material 233a. The second carbon nanotube structure 231a includes a plurality of second carbon nanotubes joined by van der Waals attractive force therebetween. Adjacent second carbon nanotubes form a plurality of second micropores. Some of the second micropores are filled with the second material. The second carbon nanotubes can be polymer coated active carbon nanotubes. The second material can be supercapacitor electrolytes.

The first supercapacitor electrode 200a and the second supercapacitor electrode 200b together form a supercapacitor 200.

In one embodiment, the structure of the second supercapacitor electrode 200b is the same as the first supercapacitor electrode 200a. The second supercapacitor electrode 200b includes a first electrode structure 210b and a second electrode structure 230b stacked with each other.

The first electrode structure 210b includes a first carbon nanotube structure 211b and a first structure made of a first material 213b, the first carbon nanotube structure 211b includes a plurality of first carbon nanotubes joined by van der Waals attractive force therebetween. Adjacent first carbon nanotubes form a plurality of first micropores. Some of the first micropores are filled with the first material.

The second electrode structure 230b includes a second carbon nanotube structure 231b and a second packaging structure made of a second material 233b. The second carbon nanotube structure 231b includes a plurality of second carbon nanotubes joined by van der Waals attractive force therebetween. Adjacent second carbon nanotubes form a plurality of second micropores. Some of the second micropores are filled with the second material.

The photocapacitor 10 further includes a first external electrode 400, a second external electrode 500, and a third external electrode 600. The first external electrode 400 is connected to the conductive surface 111 of the perovskite solar cell 100, the second external electrode 500 is connected to the first carbon nanotube structure 211a of the first supercapacitor electrode 200a, and the third external electrode 600 is connected to the first carbon nanotube structure 211b of the second supercapacitor electrode 200b.

The photocapacitor 10 further includes a shell 700 which is used to packaging the perovskite solar cell 100 and the supercapacitor 200. The shell 700 can prevent the perovskite solar cell 100 and the supercapacitor 200 contact with the outside, especially water vapor. The material of the shell 700 can be PMMA.

Figure 4:
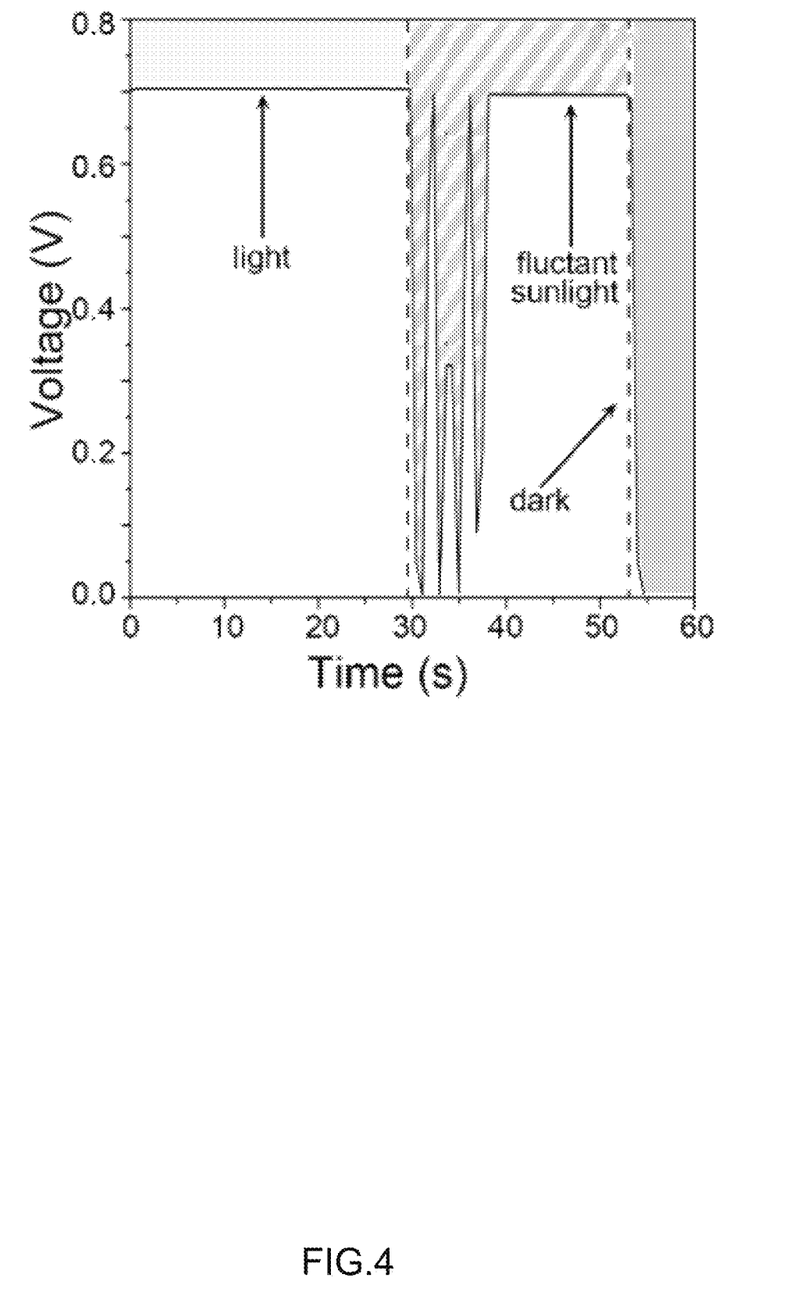
FIG. 4 is voltage output performances of a perovskite solar cell under different illumination conditions.
Figure 5:
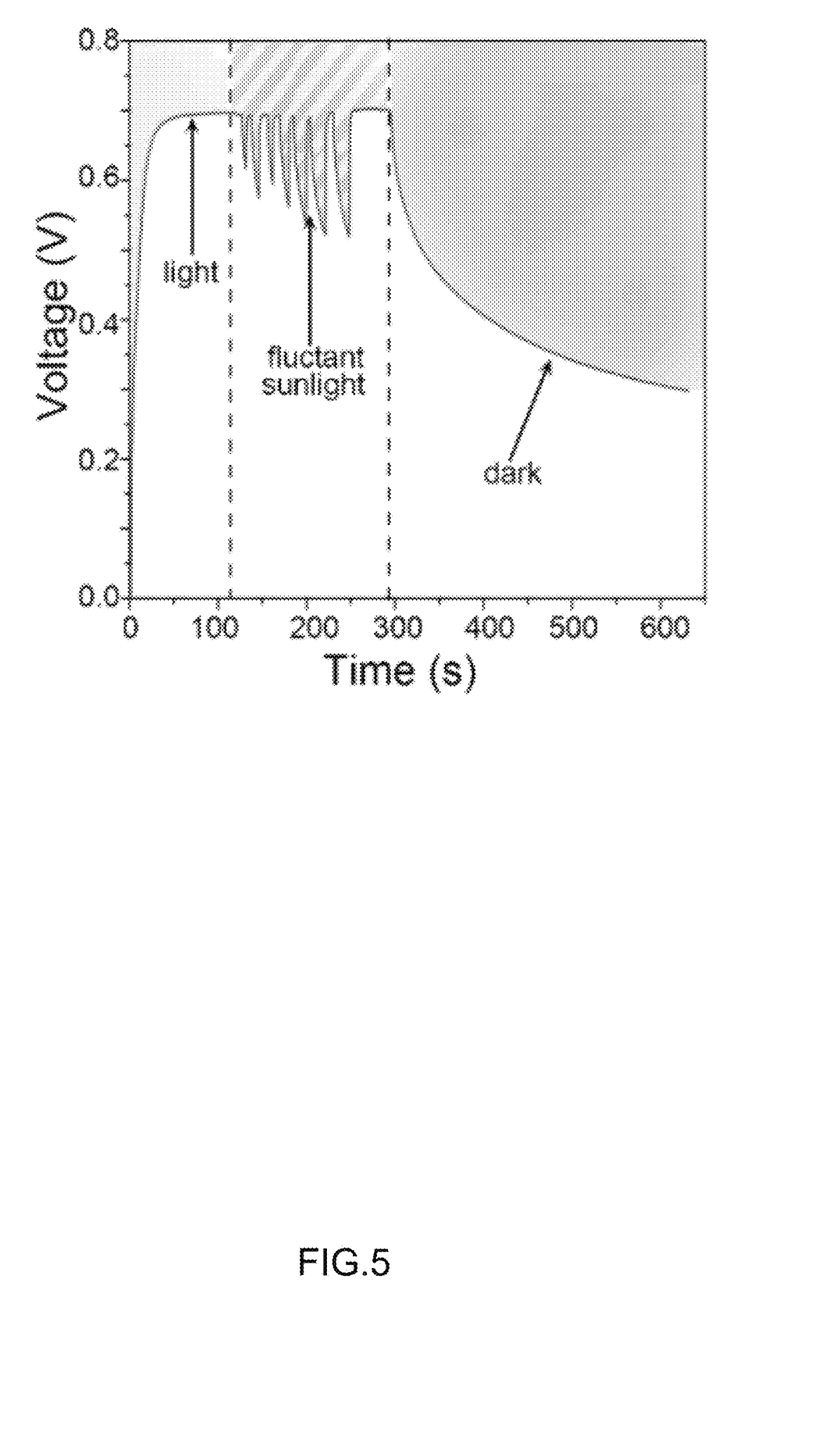
FIG. 5 is voltage output performances of a photocapacitor under different illumination conditions.

FIG. 4 and FIG. 5 are voltage output performances of perovskite solar cell 100 and photocapacitor 10 under different illumination conditions, respectively. The photocapacitor 10 may have to work under complex illumination conditions, such as light, dark, and fluctuating sunlight.

Under lighted conditions, the voltage of perovskite solar cell 100 rises rapidly to 0.7 V, while the voltage of the photocapacitor 10 rises to 0.7 V after 80 s.

Under darkened conditions, the voltage of perovskite solar cell 100 rapidly down to 0 V, while the voltage of the photocapacitor 10 declined more slowly than the perovskite solar cell 100.

Under fluctuating sunlighted conditions, the voltage of the photocapacitor 10 is more stable than that of the perovskite solar cell 100.

The photocapacitors 10 can effectively improve the voltage output under different illumination conditions. The photocapacitors 10 is suitable for portable electronics.

The embodiments shown and described above are only examples. Even though numerous characteristics and advantages of the present technology have been set forth in the forego description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A method for making a photocapacitor, comprising:
    preparing a first supercapacitor electrode comprising a first electrode structure and a second electrode structure stacked with each other, wherein the first electrode structure comprises a first carbon nanotube structure comprising a plurality of first carbon nanotubes, adjacent first carbon nanotubes form a plurality of first micropores, some of the first micropores are filled with a first material; a surface of the first electrode structure away from the second electrode structure is defined as a first electrode surface;
    preparing a perovskite solar cell comprising an absorbing layer and a cell packaging structure, wherein the absorbing layer comprises a third carbon nanotube structure and a perovskite structure, the third carbon nanotube structure is a layered structure comprising a first surface and a second surface opposite the first surface, the first surface is directly contacted with the perovskite structure and the second surface is directly contacted with the cell packaging structure; a surface of the cell packaging structure away from the absorbing layer is defined as a second solar cell surface;
    attaching the first supercapacitor electrode onto the perovskite solar cell, wherein the second solar cell surface is directly contacted with the first electrode surface;
    dissolving a portion of the cell packaging structure and the first material until the third carbon nanotube structure and the first carbon nanotube structure in direct contact with each other; and
    preparing a second supercapacitor electrode opposite to the first supercapacitor electrode.

2. The method of claim 1, wherein preparing a perovskite solar cell comprises
    providing a conductive glass layer with a conductive surface;
    depositing a blocking layer onto the conductive surface;
    locating the absorbing layer onto the blocking layer to form a perovskite solar cell preform; and
    depositing a cell packaging material on surfaces of the blocking layer and the absorbing layer to form a cell packaging structure.

3. The method of claim 2, wherein the absorbing layer is prepared by:
    depositing a $BX_2$ film onto the blocking layer, wherein $BX_2$ is a halide of metal B;
    depositing a carbon nanotube film onto the $BX_2$ film; and
    coating an AX solution onto the carbon nanotube film and heating, wherein AX is halogenated salt of organic amino A.

4. The method of claim 3, wherein $BX_2$ is $PbI_2$, AX is $CH_3NH_3I$ solution.

5. The method of claim 3, wherein the carbon nanotube of the carbon nanotube film is multi-walled carbon nanotube.

6. The method of claim 1, wherein the second electrode structure comprises a second carbon nanotube structure comprising a plurality of second carbon nanotubes, adjacent second carbon nanotubes form a plurality of second micropores, some of the second micropores are filled with a second material.

7. The method of claim 6, wherein the first supercapacitor electrode is prepared by:
    providing an active carbon nanotube film;
    soaking the active carbon nanotube film in a polymer monomer solution, adding an oxidant solution to the polymer monomer solution to generate a polymer coated active carbon nanotube film;
    providing a carbon nanotube solution, and filtering the carbon nanotube solution through the polymer coated active carbon nanotube film to create a carbon nanotube-polymer coated active carbon nanotube film; a carbon nanotube side of the carbon nanotube-polymer coated active carbon nanotube film is defined as S-side, and a polymer coated active carbon nanotube side is defined as P-side;
    coating the second material onto the P-side; and
    coating the first material onto the S-side.

8. The method of claim 7, wherein the active carbon nanotube is prepared by heating a carbon nanotube in air.

9. The method of claim 7, wherein the polymer monomer solution is an aniline/HCl aqueous solution, and the oxidant solution is a $(NH_4)_2S_2O_8$ aqueous solution.

10. The method of claim 7, wherein coating the second material onto the P-side further comprises coating $PVA/H_2SO_4$ aqueous solution onto the P-side.

11. The method of claim 7, wherein coating the first material onto the S-side further comprises soaking the carbon nanotube-polymer coated active carbon nanotube film in a PMMA/toluene solution.

12. The method of claim 1, wherein the first material and the cell packaging material are the same.

13. The method of claim 1, wherein dissolving the portion of the cell packaging structure and the first material further comprises:
    defining a surface of the second electrode structure away from the first electrode structure as a second electrode surface; and
    coating a liquid onto the second electrode surface, and the portion of the cell packaging structure and the first material are dissolved by the liquid.

14. The method of claim 13, wherein the first material and the cell packaging material is PMMA, and the liquid is chlorobenzene.

15. The method of claim 1, wherein the first supercapacitor electrode and the second supercapacitor electrode together form a supercapacitor.

\* \* \* \* \*

UNITED STATES PATENT AND TRADEMARK OFFICE
CERTIFICATE OF CORRECTION

PATENT NO. : 10,636,925 B2
APPLICATION NO. : 16/141997
DATED : April 28, 2020
INVENTOR(S) : Ru-Hao Liu, Chang-Hong Liu and Shou-Shan Fan Page 1 of 1

It is certified that error appears in the above-identified patent and that said Letters Patent is hereby corrected as shown below:

On the Title Page

Please change the Assignees "Tinghua University" to "Tsinghua University".

Signed and Sealed this
Eighth Day of December, 2020

Andrei Iancu
*Director of the United States Patent and Trademark Office*